United States Patent [19]

McCarthy

[11] Patent Number: 5,399,231

[45] Date of Patent: Mar. 21, 1995

[54] METHOD OF FORMING CRYSTALLINE SILICON DEVICES ON GLASS

[75] Inventor: Anthony M. McCarthy, Menlo Park, Calif.

[73] Assignee: Regents of the University of California, Oakland, Calif.

[21] Appl. No.: 137,411

[22] Filed: Oct. 18, 1993

[51] Int. Cl.⁶ .................... H01L 21/306; B44C 1/22; C03C 15/00
[52] U.S. Cl. .................... 156/630; 156/631; 156/633; 156/656; 156/657; 156/662; 437/86; 437/974; 148/DIG. 135
[58] Field of Search .............. 156/630, 633, 643, 653, 156/656, 657, 659.1, 662, 631; 437/21, 26, 86, 974; 148/DIG. 12, DIG. 135

[56] References Cited

U.S. PATENT DOCUMENTS

| | | | |
|---|---|---|---|
| 3,332,137 | 7/1967 | Kenney | 29/423 |
| 3,647,581 | 3/1972 | Mash | 148/DIG. 135 |
| 3,959,045 | 5/1976 | Antypas | 156/3 |
| 4,601,779 | 7/1986 | Abernathey et al. | 156/628 |
| 5,013,681 | 5/1991 | Godbey et al. | 431/86 |
| 5,086,011 | 2/1992 | Shiota | 148/DIG. 12 |
| 5,110,748 | 5/1992 | Sarna | 437/51 |

OTHER PUBLICATIONS

R. A. Lemons et al. "Laser Crystallization On Si Films On Glass", Appl. Phys. Lett., vol. 40, pp. 469–471, 1982.

J. B. Laskey et al., "Silicon–on–Insulator (SOI) by Bonding and Etch–back", Dig. 1985 IEEE Int. Electron Devices Mtng., Dec. 1985, pp. 684–687.

L. J. Spangler et al., "A Technology for High–Performance Single–Crystal Silicon–on–Insulator Transistors", IEEE Elec. Device Lett, vol. EDL-8, No. 4, Apr. 1987, pp. 137–139.

T. W. Sigmon et al., "Nanosecond Thermal Processing for Ultra–High–Speed Device Technology", Mat. Res. Soc. Symp. Proc., vol. 158, 1990, pp. 241–253.

K. H. Weiner et al., "Low–Temperature Fabrication of p+-NDiodes with 300-Å Junction Depth," IEEE Electron Device Letters, vol. 13, No. 7, Jul. 1992, pp. 369–371.

D. J. Frank et al., "Monte Carlo S.imulation of a 30nm Dual-Gate MOS FET: How Short Can Si Go?", IEEE, IEDM 92-553, Dec. 1992, pp. 21.1.1-21.1.4.

Primary Examiner—William Powell
Attorney, Agent, or Firm—Henry P. Sartorio; L. E. Carnahan

[57] ABSTRACT

A method for fabricating single-crystal silicon microelectronic components on a silicon substrate and transferring same to a glass substrate. This is achieved by utilizing conventional silicon processing techniques for fabricating components of electronic circuits and devices on bulk silicon, wherein a bulk silicon surface is prepared with epitaxial layers prior to the conventional processing. The silicon substrate is bonded to a glass substrate and the bulk silicon is removed leaving the components intact on the glass substrate surface. Subsequent standard processing completes the device and circuit manufacturing. This invention is useful in applications requiring a transparent or insulating substrate, particularly for display manufacturing. Other applications include sensors, actuators, optoelectronics, radiation hard electronics, and high temperature electronics.

20 Claims, 2 Drawing Sheets

METHOD OF FORMING CRYSTALLINE SILICON DEVICES ON GLASS

CRYSTALLINE SILICON DEVICES ON GLASS

The U.S. Government has rights in this invention pursuant to Contract No. W-7405-ENG-48 between the U.S. Department of Energy and the University of California for the operation of Lawrence Livermore National Laboratory.

BACKGROUND OF THE INVENTION

The present invention relates to fabricating crystalline silicon microelectronic components, particularly to the fabrication of microelectronic components on an insulator substrate, and more particularly to a method for producing microelectronic components in a silicon-on-glass substrate, wherein the components are formed on a silicon substrate and then transferred to a glass substrate.

Silicon-on-insulator (SOI) technologies have advanced dramatically in recent years towards the goal of producing thin single-crystal silicon films on insulated substrates. Components, such as metal-oxide-semiconductor (MOS) transistors, fabricated in SOI films have the potential for increased mobility, reduced parasitic capacitance and leakage current as well as improved radiation hardness due to reduced junction sidewall area and elimination of bottom junction area. To date, there has been no success in achieving single-crystal silicon device fabrication on less expensive glass substrates capable of withstanding temperatures of no more than 600° C. Others have achieved this with expensive glasses, such as Corning 1729 using 800° C. (see L. J. Spangler et. al., "A Technology for High-Performance Single-Crystal Silicon-on-Insulator Transistors", IEEE Electron Device Letters, Vol. 13, No. 4, April 1987, pp. 137-139), and Corning 1733 at 600° C. with compromises (see U.S. Pat. No. 5,110,748 issued May 5, 1992 to K. Sarma). SOI transistors on glass substrates are particularly attractive for sensors and displays, although many other applications are possible such as actuators, high temperature electronics, optoelectronics, and radiation hard electronics.

A wide variety of techniques have been proposed for realizing thin silicon films compatible with high-performance devices on an insulating substrate. Due to the high temperature processing requirements of silicon (greater than 800° C.), silicon-on-glass substrate processing has not been possible except on the so-called "high-temperature" glass, such as Corning 1729 glass, capable of withstanding greater than 800° C. temperatures. Other glasses used in commercial applications, such as lap-top displays, cannot withstand temperature exposures greater than 600° C., such as the Corning 7059 or other "low-temperature" glasses. Corning has discontinued manufacture of high-temperature glasses 1729, 1933 and 1724. Due to the high temperatures of silicon processing conventional silicon-on-glass techniques have relied on amorphous (a-Si) and polycrystalline (p-Si) materials which can be doped and treated at temperatures that the glass can withstand, but whose performance is decidedly inferior to crystalline films. These prior approaches to forming silicon-on-insulator substrates are exemplified by U.S. Pat. No. 5,013,681 issued May 7, 1991 to D. J. Godbey et. al., and the following articles: "Nanosecond Thermal Processing For Ultra-High-Speed Device Technology", T. W. Sigmon et. al., Materials Research Society Symp. Proc., Vol. 158, 1990, pp. 241-153; and "Low-Temperature Fabrication of p+ −n Diodes with 300-ÅJunction Depth", K. H. Weiner et. al., IEEE Electron Device Letters, Vol. 13, No. 7, July 1992, pp. 369-371.

A technique for forming single crystal silicon on insulator and single-crystal devices is presented in U.S. Pat. No 5,110,748 issued May 5, 1992 to K. Sarma. This approach suffers from the drawback that the sheet resistance of the implanted layers is high since these layers are annealed at 600° C. The mobility of the ELO (epitaxial layer overgrowth) layer is also less than ideal due to the formation of grain boundaries over the dielectric of interest. Furthermore, the back interface of the silicon underneath the active device area has a cusp which may cause back gate control problems.

Recently, a silicon-on-glass process has been developed using pulsed laser doped silicon layers, as described and claimed in copending U.S. application Ser. No. 08/137,401, filed Oct. 18, 1993, entitled "A Method For Forming Silicon On A Glass Substrate". Also, a process has been developed for forming buried components in the silicon-on-glass substrate and for providing electrical contacts for the buried components using pulsed laser energy, as described and claimed in copending U.S. application Ser. No. 08/137,412, filed Oct. 18, 1993, entitled "Silicon On Insulator With Active Buried Regions".

While these recent efforts have resulted in a significant advance in the SOI technologies, there are significant advantages to utilizing the conventionally known high temperature processing, but there is a need for the capability to produce microelectronic devices on glasses incapable of withstanding temperatures greater than 600° C. These advantages relate to the immediate ability of silicon microelectronics firms to take advantage of this technology without significant capital investment. The present invention satisfies this need by providing a process in which a low-temperature glass substrate may be used in a silicon-on-insulator device. This is accomplished by first forming the microelectronic device on a silicon substrate and then transferring it to a glass substrate. Thus, crystalline silicon films can be utilized, instead of the previously used amorphous and polycrystalline silicon films, in SOI devices.

SUMMARY OF THE INVENTION

It is an object of the present invention to provide single-crystal silicon devices on a glass substrate.

A further object of the invention is to provide microelectronic devices formed on silicon-on-insulator substrates using conventional processing techniques for forming the microelectronic devices, while having the capability of using "low-temperature" type glass as the substrate.

Another object of the invention is to provide a method for fabricating silicon-on-glass devices using conventional high-temperature processing and low-temperature glass substrates.

Another object of the invention is to provide a process for producing SOI devices wherein the microelectronic devices are formed on a silicon substrate and then transferred to a glass substrate.

Other objects and advantages of the present invention will become apparent from the following description and accompanying drawings. The invention involves forming microelectronic devices on a silicon substrate using conventional high temperature processing, prior to transferring the microelectronic devices onto a glass substrate and removing the silicon substrate. By this method low-temperature, less expensive glass substrates may be utilized without undergoing the high, greater than 600° C., processing temperatures involved in forming the devices. Thus, conventional silicon processing techniques can be effectively utilized to produce the devices in silicon-on-insulator films.

BRIEF DESCRIPTION OF THE DRAWINGS

The accompanying drawings, which are incorporated into and form a part of the disclosure, illustrate embodiments of the invention and, together with the description, serve to explain the principles of the invention.

DETAILED DESCRIPTION OF THE INVENTION

The present invention is a method for fabricating single-crystal silicon device components on a silicon substrate using conventional high temperature silicon processing techniques, and then transferring the components to a glass substrate. High temperature processing of single-crystal-silicon-on-glass substrates has not been possible, except where expensive, "high-temperature" glass is used as a substrate, due to the limited temperatures that can be reliably endured by the glass material. Thus, in the past, glass substrates requiring processing temperatures of less than about 600° C. have found limited use, since the normal silicon processing temperatures are above 750° C. The present invention produces single-crystal silicon devices on glass substrates. This is accomplished by forming a first etch stop layer on a silicon wafer, epitaxially growing an intermediate silicon layer, depositing a second etch stop layer, depositing a final device quality silicon layer on the etch stop layer, forming the components in this final silicon layer, bonding the silicon layer to a glass substrate, and then removing the silicon wafer, the first etch stop layer, the intermediate silicon layer, and the second etch stop layer, leaving the silicon device layer and components contained therein on the glass substrate.

Figure 1:
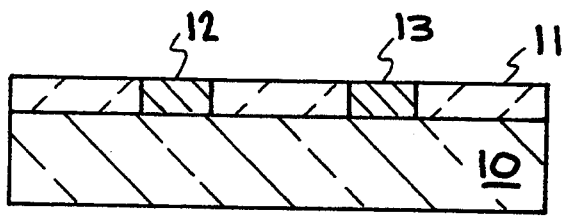
FIG. 1 illustrates a simplified embodiment of a single-crystal silicon layer on a glass substrate depicted with implanted and activated regions as made in accordance with the present invention.

An embodiment of a silicon-on-glass component, where the component is defined as an almost complete device, as made in accordance with the invention, is shown in FIG. 1, and comprises a glass wafer or substrate 10 having a device layer 11 of silicon bonded to the glass 10, and in which implants 12 and 13 have been placed and activated prior to bonding. In this Figure, layers which may lie between the glass 10 and silicon 11 have been omitted for clarity. These may include dielectrics and light shield layers.

Figure 2:
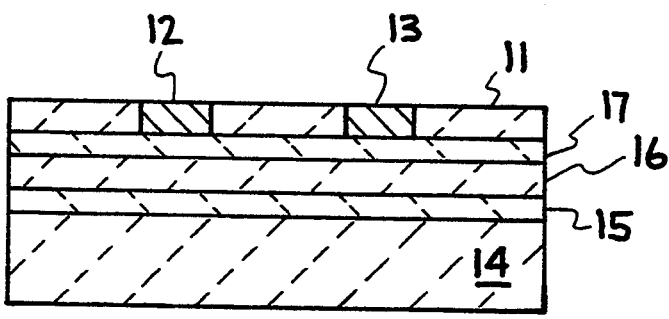
FIGS. 2-4 illustrate the fabrication process for forming the device in FIG. 1.
Figure 3:
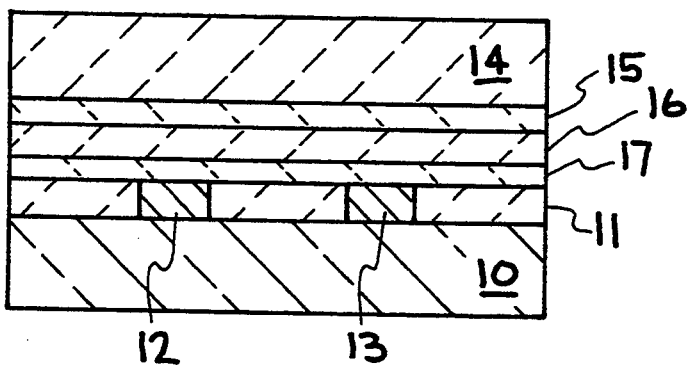
Figure 4:
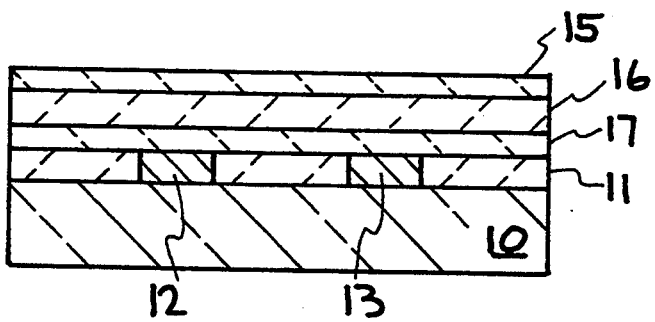

The FIG. 1 embodiment is produced as follows, with reference to FIGS. 2-4:

1. A silicon wafer 14 having a thickness of about 0.1-1.5 mm and having a (100) orientation is used as the starting substrate.

2. A boron doped first etch stop, layer 15 shown in FIG. 2, is formed on the silicon wafer 14 with boron level exceeding about 5e19/cm$^3$. Typical means of forming this layer are implantation, epitaxy or liquid source doping in a furnace at temperatures in excess of 750° C. The thickness of the layer 15 is determined by the selectivity of the etching technique subsequently used to remove the silicon wafer. In the experiment a liquid source doped boron layer, about 3 microns thickness of which exceeded the required doping level was used.

An intermediate silicon layer, 16, is epitaxially grown on the etch stop surface. In this example the thickness of layer 16 was 1.5 microns. A suitable thickness of layer 16 exceeds 0.5 microns.

A second etch stop layer 17, may be an epitaxially grown boron doped silicon layer or a silicon-germanium layer (or other silicon alloy, as in above-referenced U.S. Pat. No. 5,013,681). If a boron doped layer is used the thickness required will exceed about 500Å and the doping density will exceed about 5e18/cm$^3$. In the event a silicon-germanium (SiGe) epitaxial layer 17 is used, it should have a thickness of about 100-1500Å. Doping may be used in the SiGe layer but is not necessary to achieve adequate etch stop properties. The SiGe layer may have between 1 and 50% Ge. An undoped thickness of about 500Å is usually sufficient. In experimental verification, we have used 10-25% SiGe layers.

3. An epitaxial layer 11 of device quality silicon, thickness of 0.01-1 μm, is epitaxially deposited on the etch stop layer 15 (see FIG. 2). A low doping concentration in the range 1e14cm$^3$-1e16/cm$^3$ layer is suitable for MOS device applications.

4. The silicon layer 11 is implanted with the desired dopant species to form the source/drain regions 12 and 13, and then activated at a temperature over 600° C. (see FIG. 2). The regions 12 and 13 may be implanted with boron or phosphorous, for example. The etch stop material (SiGe) will normally sustain short anneals in the temperature range of 600° C.-800° C. without adverse effects.

5. A glass wafer 10 is bonded to the layer 11 on silicon substrate 14 (see FIG. 3) by anodic bonding using a voltage in the range 500-5000V at a temperature in the range 278° C.-700° C. Other conventional techniques such as eutectic bonding and gluing may be utilized, and such techniques are defined herein as "bonding".

6. The silicon wafer substrate 14 is removed leaving the etch stop layer 15 exposed, as shown in FIG. 4. This can be accomplished by polishing and/or wet/dry etching techniques. Polishing, using a diamond containing slurry, is used to grind down the silicon wafer to a thickness of 100-200 μm followed by a wet or dry etch to complete removal of the silicon wafer. A wet etch of a 3:1 H$_2$O/KOH was used at 80° C. Typical H$_2$O/KOH compositions consist of 1:1-5:1. The time period of wet etching in this example was 8 hours. If desired, for the final 30 μm of the silicon wafer etch, Isopropanol (ISO) may be added to the H$_2$O/KOH solution in excess of solubility and temperature may be reduced to provide a very sensitive etch stop. For example, a solution of 2:6:1 KOH:H$_2$O:ISO at 60° C. may be used. The etch rate of lightly doped silicon in this solution is about 2500Å/minute whereas the etch rate of heavily boron doped silicon and SiGe is about 30Å/minute.

7. The first etch stop layer 15 is removed by wet or dry etching. In this example, the layer 15 is etched by plasma etching in a $SF_6/C_2ClF_5$ environment using a power content of about 0.25 Watts/cm$^2$ for about 25 minutes.

8. The intermediate silicon layer 16 is removed using the same selective etch of 3:1 KOH with Isoproponal added above liquid solubility as mentioned in paragraph 6.

9. The second etch stop layer 17 is removed with a 5:1:1 $H_2O:H_2O_2:NH_4OH$, leaving the silicon-on-glass device of FIG. 1.

If desired, a thin (thickness of 100Å to 1 micron) layer of dielectric material may be deposited as a barrier on the glass substrate 10 or silicon layer 11 prior to bonding to the silicon wafer 14. For example, this barrier material may be silicon nitride, silicon dioxide, or silicon oxynitrides deposited by plasma enhanced chemical vapor deposition at temperatures in the range of 100°–400° C., described in greater detail in above-referenced copending U.S. application Ser. No. 08/137,401. A standard process on the glass prior to bonding is to deposit a light shield layer followed by a dielectric (see above-referenced U.S. Pat. No. 5,110,748 for exmple). An alternative approach is to deposit a low temperature oxide followed by a metal light-shield layer on the wafer prior to the deposition of the dielectric layer on the silicon. Contact holes may be made to the silicon through the oxide to permit current to flow during the anodic bonding. In this last case the glass may be undersized to permit electrical access to the light shield layer which acts as the anode during bonding.

If roughness of the silicon surface layer occurs following etching of the etch stop layer, silicon it may be smoothed by scanning an excimer laser over the silicon surface causing the surface to melt. Surface tension causes smoothing during recrystallization, as described in greater detail in above-referenced copending U.S. application Ser. No. 08/137,401. This smoothing operation may be performed after completing the etch of silicon wafer 14 and layers 17, 16 and 15.

Figure 4A:
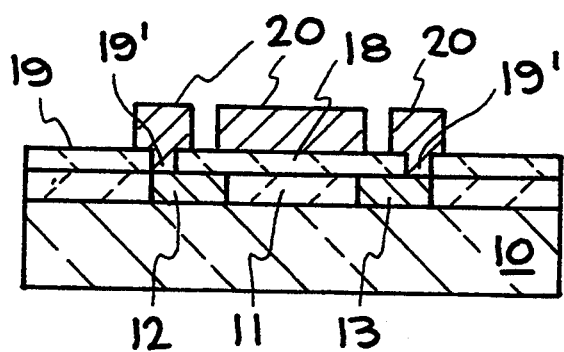
FIG. 4A illustrates a MOS device after forming the thin silicon layer on a glass substrate complete with implanted and activated regions, and completing the required processing.

After forming the thin film of silicon on glass as shown in FIG. 1, the glass wafer may be processed in a standard fashion to produce MOS SCS devices on the glass. A typical sequence may be as follows: Deposit a low temperature oxide 18 over layer 11 and pattern and etch layers 18 and 11 into silicon islands. A second low temperature oxide 19 is deposited to cover the exposed edges of the silicon islands. A contact hole pattern indicated at 19' is formed and etched to allow access to the source and drain regions. A metal layer 20 is deposited and patterned to form the source and drain contact metallizations and the gate electrode of the device as shown in FIG. 4A.

Figure 5:
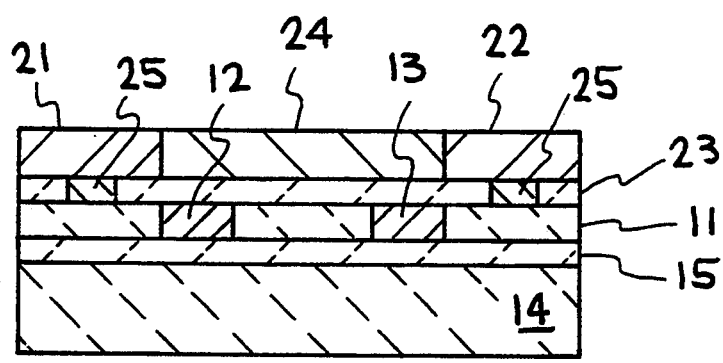
FIGS. 5 and 6 illustrate alternative processing operations performed on the silicon wafer prior to bonding that may be utilized in carrying out the present invention.

One caveat to this technique is the possibility of causing electrical damage to the components 12 and 13 during the anodic bonding process. To circumvent this, FIG. 5 illustrates a modification of the process described above with respect to FIG. 2 and prior to bonding the glass wafer 10 to the silicon layer 11. This modification involves the formation of spacers 21 and 22 over a low-temperature oxide layer 23 deposited on device silicon layer 11, as shown in FIG. 5. The spacers may be composed of any conductive material having a thickness equal to a subsequent metal layer 24. The spacer material electrically contacts the silicon layer 11 outside the device regions 12 and 13 through contact region 25. The advantage of this technique is that the bonding potential is shorted to the silicon substrate away from the devices, thus electrically protecting the devices from the bonding potential.

Figure 6:
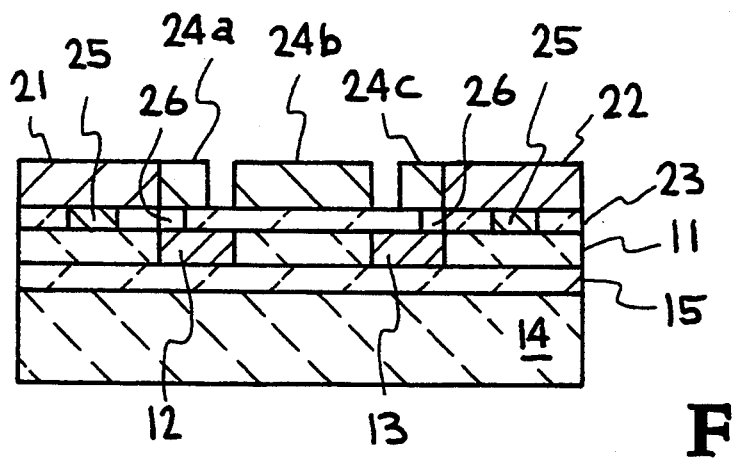

FIG. 6, illustrates a further modification of the process illustrated in FIG. 5 by, in addition to the spacers 21 and 22, providing implementation of the metallization and patterning of the metal layer 24 of FIG. 5 on the surface of the low temperature oxide layer 23 prior to bonding, as indicated at the source 24A, the gate 24B, and the drain 24C in FIG. 6, with the source 24A and drain 24C being connected to components 12 and 13 via contact 26.

It has thus been shown that the present invention provides a method of producing single-crystal silicon components on glass substrates using conventional processing techniques, by first fabricating the single-crystal silicon devices on the silicon substrate, transferring the thus formed components to a glass substrate, and then removing the silicon substrate and extra layers. Thus, less expensive, low-temperature glass substrates, which do not withstand the conventional silicon processing temperatures, can be used.

While a particular embodiment has been illustrated and specific operational sequences have been described and/or illustrated, such is not intended to limit the invention. Modifications and changes will become apparent to those skilled in the art, and it is intended that the invention only be limited by the scope of the appended claims.

I claim:

1. A method for forming silicon devices on glass comprising:
    forming at least a layer of silicon on a silicon substrate;
    introducing at least one region with a dopant species in the layer of silicon;
    bonding the layer of silicon to a glass substrate; and
    removing the silicon substrate.

2. The method of claim 1, additionally including forming an etch stop layer on the silicon substrate prior to forming the layer of silicon thereon.

3. The method of claim 1, additionally including forming at least a dielectric layer on the glass substrate or silicon layer prior to bonding the layer of silicon to the glass substrate.

4. The method of claim 1, additionally including forming at least one spacer on the layer of silicon prior to bonding the layer of silicon to the glass substrate.

5. The method of claim 4, additionally including implementation of metallization of the surface of the layer of silicon prior to bonding the layer of silicon to the glass substrate.

6. The method of claim 1, additionally including smoothing the surface of the layer of silicon by directing laser energy thereon causing melting, and allowing the surface to recrystallize.

7. The method of claim 1, wherein removing of the silicon substrate is carried out by a polishing technique followed by an etching technique.

8. The method of claim 1, wherein the layer of silicon is epitaxially formed.

9. The method of claim 1, wherein the at least one region formed in the layer of silicon is formed by implantation of a dopant species and activation thereof.

10. The method of claim 1, additionally including forming an etch stop layer on the silicon substrate prior to forming the silicon layer by implantation, epitaxy or liquid source doping, and then forming the layer of silicon on the etch stop layer.

11. The method of claim 10, additionally removing the etch stop layer following removal of the silicon substrate.

12. The method of claim 11, wherein the etch stop layer is removed by plasma etching.

13. The method of claim 1, additionally including forming a plurality of etch stop and silicon layers, with a first of the etch stop layers being formed on a surface of the silicon substrate.

14. A crystalline silicon device on glass, formed by the method of claim 1, wherein the glass is of a type incapable of withstanding silicon layer processing temperatures of over about 600° C.

15. In a process for producing crystalline silicon microelectronic components on a glass substrate, the improvement comprising:
    forming the crystalline silicon microelectronic components on a silicon substrate;
    transferring the thus formed components to a glass substrate; and
    removing the silicon substrate.

16. The improvement of claim 15, wherein the crystalline silicon microelectronic components are formed on the silicon substrate by:
    providing at least one etch stop on a surface of the silicon substrate;
    forming at least one silicon layer on the etch stop layer; and
    forming the microelectronic components in the silicon layer.

17. The improvement of claim 16, wherein transferring the components to a glass substrate is carried out by bonding the silicon layer to a glass substrate.

18. The improvement of claim 17, wherein removing the silicon substrate is carried out by a process selected from the group of polishing, dry etching, wet etching, and a combination of polishing and dry or wet etching.

19. The improvement of claim 16, additionally including:
    depositing a low temperature oxide layer on the silicon layer;
    patterning and etching the oxide and silicon layers to form silicon islands;
    depositing a second low temperature oxide layer on exposed edges of the silicon islands;
    forming a contact pattern through the oxide layers with the components; and
    forming a patterned metal layer on the oxide layer.

20. The improvement of claim 16, additionally including:
    forming an oxide layer on the surface of the silicon layer and the microelectronic components;
    forming contact regions in the oxide layer;
    forming spacers of conductive material over the oxide layer;
    forming contacts intermediate the patterned metal layer and the microelectronic components; and
    forming a patterned metal layer over sections of the oxide layer and intermediate the spacers.

* * * * *